United States Patent
Chang et al.

(10) Patent No.: US 9,964,612 B2
(45) Date of Patent: May 8, 2018

(54) RF TRAP, SUPERCONDUCTING MAGNET APPARATUS INCLUDING THE SAME, AND MAGNETIC RESONANCE IMAGING APPARATUS

(71) Applicant: SAMSUNG ELECTRONICS CO., LTD., Suwon-si (KR)

(72) Inventors: Min-Soo Chang, Hwaseong-si (KR); Seul-gi Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 770 days.

(21) Appl. No.: 14/513,322

(22) Filed: Oct. 14, 2014

(65) Prior Publication Data
US 2015/0108983 A1 Apr. 23, 2015

(30) Foreign Application Priority Data
Oct. 22, 2013 (KR) .................. 10-2013-0126106

(51) Int. Cl.
*G01V 3/00* (2006.01)
*G01R 33/3815* (2006.01)
*G01R 33/36* (2006.01)

(52) U.S. Cl.
CPC ..... *G01R 33/3815* (2013.01); *G01R 33/3685* (2013.01)

(58) Field of Classification Search
CPC .................. G02R 33/3815; G02R 33/3685
USPC ............................................... 324/322
See application file for complete search history.

(56) References Cited

U.S. PATENT DOCUMENTS 6,847,210 B1 * 1/2005 Eydelman .......... G01R 33/341
324/318
8,400,153 B2 3/2013 Evers et al.
2009/0315642 A1 12/2009 Evers et al.

FOREIGN PATENT DOCUMENTS

| KR | 100427146 B1 | 4/2004 | |
| KR | 100891057 B1 | 3/2009 | |
| KR | 101126047 B1 | 3/2012 | |
| WO | WO 2005069028 A1 * | 7/2005 | ......... G01R 33/3685 |

OTHER PUBLICATIONS

Communication dated Mar. 19, 2015 by the Korean Intellectual Property Office in related Application No. 1020130126106.

* cited by examiner

*Primary Examiner* — Susan Lee
(74) *Attorney, Agent, or Firm* — Sughrue Mion, PLLC

(57) ABSTRACT

A radio frequency (RF) trap for a superconducting magnet apparatus includes an electromagnetic wave shield which includes a conductive shield member and is configured to surround an electric cable; and a circuit member which is provided in a portion of the electromagnetic wave shield, and includes a conductor circuit electrically connected to the conductive shield member in at least two positions. Two positions at which the conductive shield member is electrically connected to the conductor circuit are selectively adjusted so that a current path of the conductor circuit is adjustable according to the two positions at which electrical connections are made.

20 Claims, 7 Drawing Sheets

RF TRAP, SUPERCONDUCTING MAGNET APPARATUS INCLUDING THE SAME, AND MAGNETIC RESONANCE IMAGING APPARATUS

CROSS-REFERENCE TO RELATED APPLICATION

This application claims priority from Korean Patent Application No. 10-2013-0126106, filed on Oct. 22, 2013, in the Korean Intellectual Property Office, the disclosure of which is incorporated herein in its entirety by reference.

BACKGROUND

1. Field

Exemplary embodiments relate to a radio frequency (RF) trap, a superconducting magnet apparatus including the same, and a magnetic resonance imaging (MRI) apparatus, and more particularly, to an RF trap in which load impedance is finely optimized, a superconducting magnet apparatus including the same, and a magnetic resonance imaging apparatus.

2. Description of the Related Art

An RF trap is used to remove a common mode current occurring due to induction of the current of a transmission source on an electric cable, for example, on an RF transmission (Tx) line. The RF trap is attached to an outer conductor of an RF transmission line for power-feeding of the transmit RF coil of, for example, a magnetic resonance imaging (MRI) apparatus and is used to remove a current induced on the outer conductor of the transmission line which affects the performance of the MRI apparatus.

A related art RF trap is attached to the RF power-feeding transmission line of the MRI transmit RF coil and includes a fine-optimization unit for generating a load impedance value suitable for a relevant frequency to enable cylindrical inner/outer conductors that perform shielding to prevent RF signals of a transmitter from being induced on a power-feeding line and the RF trap to effectively remove and attenuate RF radiation signal sources.

In the related art RF trap structure, optimization for load impedance is made by a combination of capacitance value and a structure that is attached between an outer conductor and an inner conductor of an electromagnetic wave shield and the load impedance is generated at a relevant frequency. However, the related art method is problematic because the attached structure and shape of the inner and/or outer conductor have to be redesigned in each instance and/or many capacitor elements have to be combined and attached for load impedance optimization, and optimization for finer load impedance according to the relevant frequency is difficult to fine-tune and implement.

SUMMARY

Exemplary embodiments may address at least the above problems and/or disadvantages and other disadvantages not described above. Also, the exemplary embodiments are not required to overcome the disadvantages described above, and may not overcome any of the problems described above.

One or more exemplary embodiments include an RF trap in which load impedance is generated or finely optimized according to a relevant frequency, a superconducting magnet apparatus including the same, and a magnetic resonance imaging apparatus.

One or more exemplary embodiments include a radio frequency (RF) trap which includes: an electromagnetic wave shield including a conductive member and surrounding an electric cable; and a circuit member provided in a partial area of the electromagnetic wave shield, wherein the circuit member includes a conductor circuit electrically connected to the conductive member of the electromagnetic wave shield at least two positions, and the at least two positions at which the conductive member is electrically connected to the conductor circuit are selectively adjusted and a current path of the conductor circuit is adjustable according to the at least two electrical connection positions.

The at least two electrical connections may be made by soldering or wiring.

The electromagnetic wave shield may have a cylindrical shape.

The electromagnetic wave shield may include a cylindrical dielectric and the conductive member may include a conductive thin film provided on at least any one of an inner circumferential surface and an outer circumferential surface of the cylindrical dielectric.

The circuit member may be disposed at least one of a front end and a rear end of the electromagnetic wave shield.

The circuit member may be a flat donut-shaped circuit board. An electric cable is expected to pass through a hollow of the cylindrical dielectric.

The conductor circuit may include a circular conductor formed on a circular board surface of the circuit member and the circular conductor has at least one gap and is short-circuited.

The conductor circuit may include a plurality of conductor strips arranged in a row and along a circle on a circular board surface of the circuit member.

The conductor circuit may include a plurality of conductor strips arranged in a mesh grid shape on a circular board surface of the circuit member.

The circuit member may be disposed in a side of the electromagnetic wave shield.

The electromagnetic wave shield may include a cylindrical dielectric, and the conductive member may be provided on an outer circumferential surface of the cylindrical dielectric and may include a first conductive thin film and a second conductive thin film spaced from each other according to a length direction of the cylindrical dielectric.

The circuit member may be provided between the first conductive thin film and the second conductive thin film on the outer circumferential surface of the cylindrical dielectric.

The conductor circuit may include a circular conductor formed along a cylindrical side circumference of the electromagnetic wave shield and the circular conductor has at least one gap and is short-circuited.

The conductor circuit may include conductor strips arranged along a cylindrical side circumference of the electromagnetic wave shield.

The electromagnetic wave shield may be divided into semi-cylindrical shapes.

The RF trap may further include a capacitor that is provided in a partial area of the electromagnetic wave shield.

The electromagnetic wave shield may include a cylindrical dielectric and the capacitor may be provided in any one end of a front end and a rear end of the cylindrical dielectric, and the capacitor may be provided in the other end of the front end and the rear end of the electromagnetic wave shield.

The capacitor may be provided in the side of the electromagnetic wave shield.

According to an aspect of an exemplary embodiment, a superconducting magnet apparatus includes: a magnetic field application unit including a superconducting coil; a controller that drives and controls the magnetic field application unit; an electric cable that connects the magnetic field application unit to the controller; and an RF trap that are mounted in the electric cable partially or continuously, wherein the RF trap includes an electromagnetic wave shield including a conductive member and surrounding an electric cable; and a circuit member provided in a partial area of the electromagnetic wave shield, the circuit member includes a conductor circuit electrically connected to the conductive member of the electromagnetic wave shield at least two positions, and the at least two positions at which the conductive member is electrically connected to the conductor circuit are selectively adjusted and a current path of the conductor circuit is adjustable according to the at least two electrical connection positions.

According to an aspect of an exemplary embodiment, a magnetic resonance imaging apparatus includes a housing that has an imaging space for magnetic resonance imaging to which magnetic field is applied; a main magnet which is mounted in the housing and to which main magnetic field is applied; a gradient coil assembly that is mounted in the housing and applies gradient magnetic field; a radio frequency (RF) coil assembly that is mounted within the housing or in the imaging space; a controller that drives and controls the main magnet, the gradient coil assembly, and the RF coil assembly; an electric cable that connects at least one of the main magnet, the gradient coil assembly, and the RF coil assembly to the controller; and an RF trap that is mounted in the electric cable partially or continuously, wherein the RF trap includes an electromagnetic wave shield including a conductive member and surrounding an electric cable; and a circuit member provided in a partial area of the electromagnetic wave shield, the circuit member includes a conductor circuit electrically connected to the conductive member of the electromagnetic wave shield at least two positions, and the at least two positions at which the conductive member is electrically connected to the conductor circuit are selectively adjusted and a current path of the conductor circuit is adjustable according to the at least two electrical connection positions.

BRIEF DESCRIPTION OF THE DRAWINGS

The above and/or other aspects will become more apparent by describing certain exemplary embodiments with reference to the accompanying drawings, in which.

DETAILED DESCRIPTION

Figure 1:
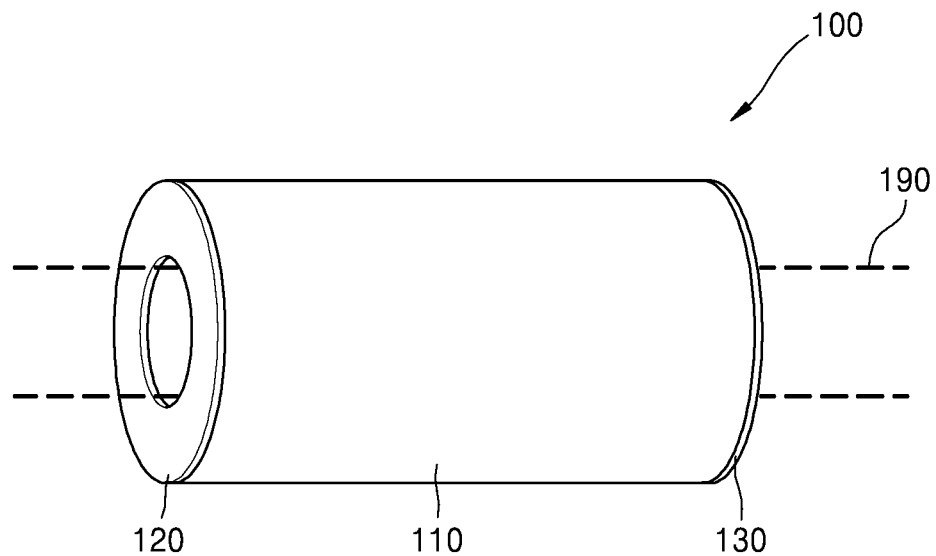
FIG. 1 schematically illustrates an RF trap according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

It will be understood that the terms "comprise", "include", and "have", when used herein, specify the presence of stated elements, but do not preclude the presence or addition of other elements, unless otherwise defined.

Figure 2:
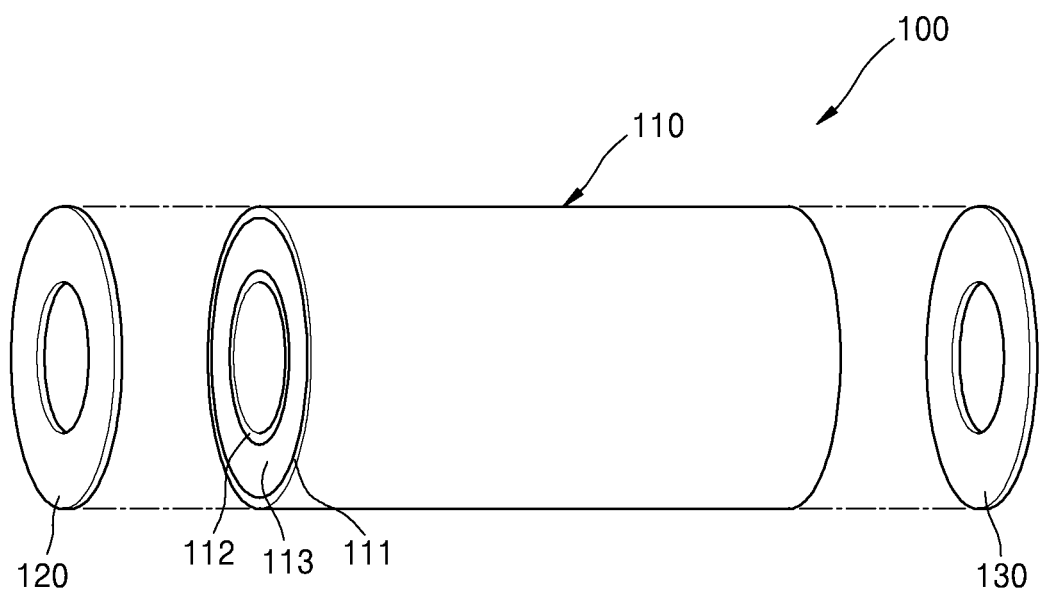
FIG. 2 is a detailed view of the RF trap of FIG. 1.

FIG. 1 schematically illustrates a radio frequency (RF) trap according to an exemplary embodiment. FIG. 2 is a detailed view of the RF trap of an exemplary embodiment.

Referring to FIGS. 1 and 2, the RF trap 100 according to an exemplary embodiment includes an electromagnetic wave shield 110 and a first circuit member 120, i.e., a circuit for inductance adjustment.

The electromagnetic wave shield 110 includes a cylindrical dielectric 113, and an outer conductive thin film 111 and an inner conductive thin film 112 respectively provided on an outer circumferential surface and inner circumferential surface of the cylindrical dielectric 113. An electric cable 190 is expected to pass through a hollow of the cylindrical dielectric 113. The outer conductive thin film 111 and the inner conductive thin film 112 shield electromagnetic wave from the electric cable 190.

The first circuit member 120 is attached to an end of the electromagnetic wave shield 110. The first circuit member 120 may be a circuit board having a flat donut-shaped (that is, having a circular board surface) corresponding to the circular shape of the end of the electromagnetic wave shield 110. The first circuit member 120 may be a grid or flexible printed circuit board. An electric cable 190 is expected to pass through the hollow of the first circuit member 120.

Figure 3:
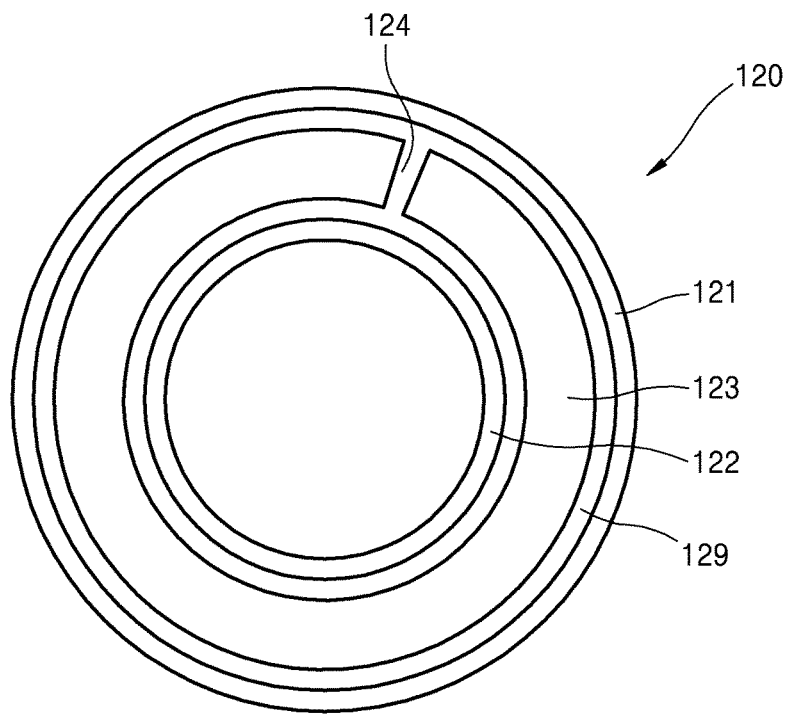
FIG. 3 illustrates an example of the first circuit member of the RF trap of FIG. 1.

FIG. 3 illustrates an example of the conductor circuit of the first circuit member of the RF trap of FIG. 1. Referring to FIG. 3, the first circuit member 120 includes conductor circuits 121, 122 and 123 formed on the circular board surface 129. An outer conductor circuit 121 is formed in the outer perimeter of the circular board surface 129 and an inner conductor circuit 122 is formed in the inner perimeter of the circular board surface 129. The outer conductor circuit 121 is electrically connected to the outer conductive thin film 111 of the electromagnetic wave shield 110 and the inner conductor circuit 122 is electrically connected to the inner conductive thin film 112 of the electromagnetic wave shield 110. When the board surface 129, on which the conductor circuits 121, 122 and 123 of the first circuit member 120 are formed, directly contacts and is connected to an end of the electromagnetic wave shield 110, the outer and inner conductor circuits 121 and 122 are electrically connected to the outer and inner conductive thin films 111 and 112. When the rear surface of the board surface on which the conductor circuits 121, 122 and 123 of the first circuit member 120 are formed directly contacts and is connected to the end of the electromagnetic wave shield 110, a through hole (not illustrated) is formed in the board of the first circuit member 120 or the outer and inner conductor circuits 121 and 122 extend to bypass the outer side and inner side of the board and thus, the outer and inner conductor circuits 121 and 122 are electrically connected to the outer and inner conductive thin films 111 and 112.

A central conductor circuit 123 may be a circular conductor formed on the circular board surface 129. The central conductor circuit 123 is formed between and apart from the outer conductor circuit 121 and the inner conductor circuit 122. The central conductor circuit 123 has at least one gap 124 formed in its circular body and may be short-circuited. That is, the central conductor circuit 123 has a ring shape having the gap 124. The central conductor circuit 123 is electrically connected to the outer and inner conductive thin films 111 and 112 of the electromagnetic wave shield 110, thereby electrically connecting the thin films as described below.

Figure 4A:
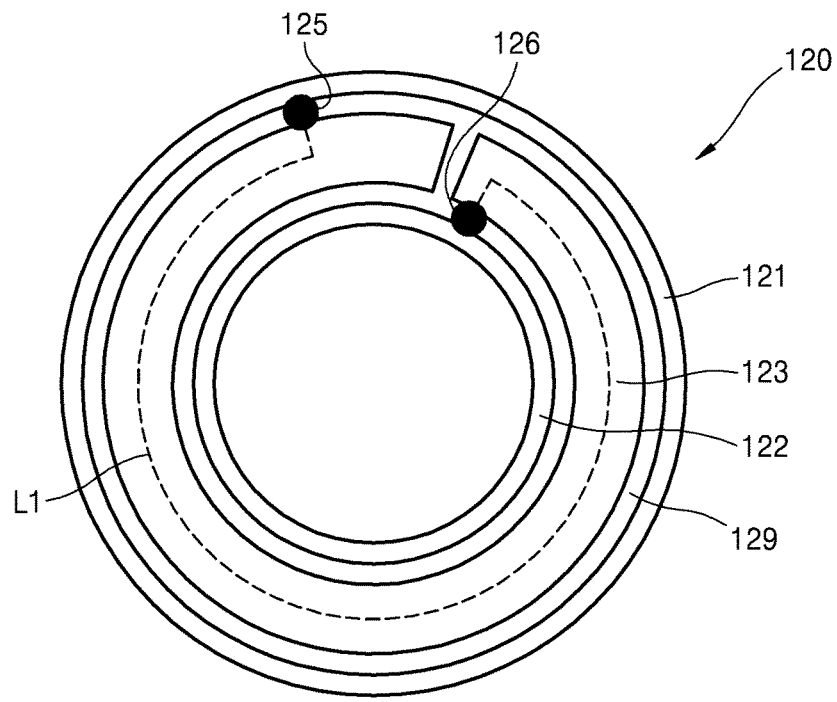
FIGS. 4A and 4B illustrate examples of electrical connections of the first circuit member of FIG. 3.
Figure 4B:
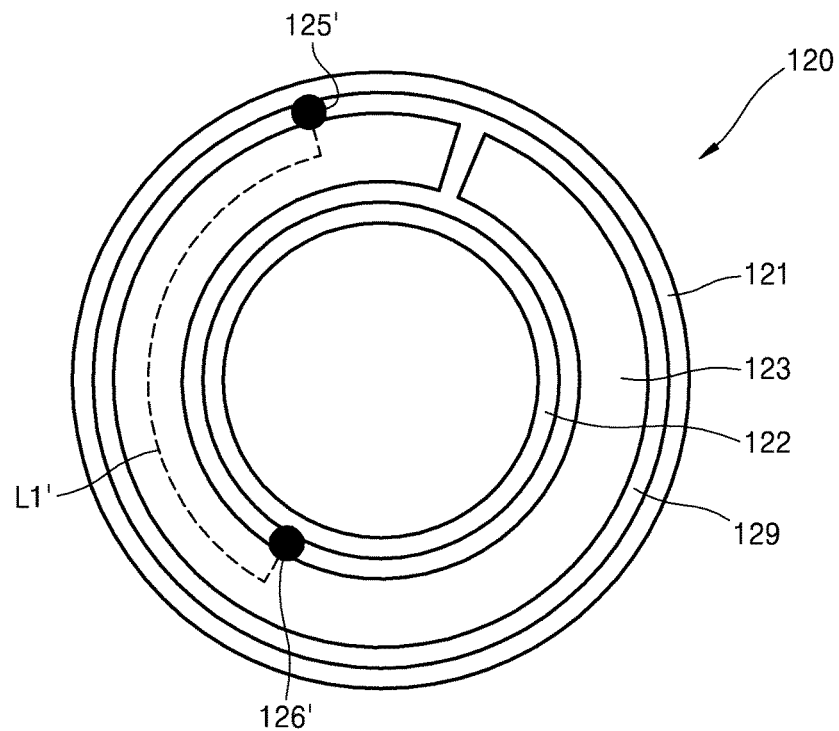

FIGS. 4A and 4B illustrate examples of electrical connection of the first circuit member of FIG. 3. Referring to FIG. 4A, the central conductor circuit 123 and the outer conductor circuit 121 are electrically connected to each other through a first solder 125, and the central conductor circuit 123 and the inner conductor circuit 122 are electrically connected to each other through a second solder 126. As described above, since the outer conductor circuit 121 and the inner conductor circuit 122 are electrically connected to the outer conductor thin film 111 and inner conductor thin film 112 of the electromagnetic wave shield 110 respectively, the positions (that is, electrical connection positions) of the first and second solders 125 and 126 determine the current path length L1 of the outer conductive thin film 111 and inner conductive thin film 112 of the electromagnetic wave shield 110. As illustrated in FIG. 4B, when the positions of the first and second solders 125' and 126' are changed, the length L1' of the current path of the outer conductive thin film 111 and the inner conductive thin film 112 is changed. The length of the transmission line may be related to the inductance of the transmission line. As illustrated in FIGS. 4A and 4B, the RF trap 100 according to an exemplary embodiment may have an adjustable current path length by selecting the positions (that is, electrical connection positions) of solders of the first circuit member 120, which means that the inductance of the RF trap 100 may be adjusted by properly selecting the positions of solders.

Although an exemplary embodiment is described by using solder as an example of performing electrical connection, an exemplary embodiment is not limited thereto. The electrical connection may be performed using wiring, conductive tape adhesion, or known methods. Although electrical connection is made at two positions according to an exemplary embodiment, electrical connection may be made at three or more positions.

A second circuit member 130, i.e., a circuit for capacitance adjustment, may be attached additionally to the other end of the electromagnetic wave shield 110. The second circuit member 130 may be also a circuit board having a flat donut-shaped (that is, having a circular board surface) corresponding to the circular shape of the end of the electromagnetic wave shield 110. The second circuit member 120 may be a grid or flexible printed circuit board. The electric cable 190 is expected to pass through the hollow of the second circuit member 130.

Figure 5:
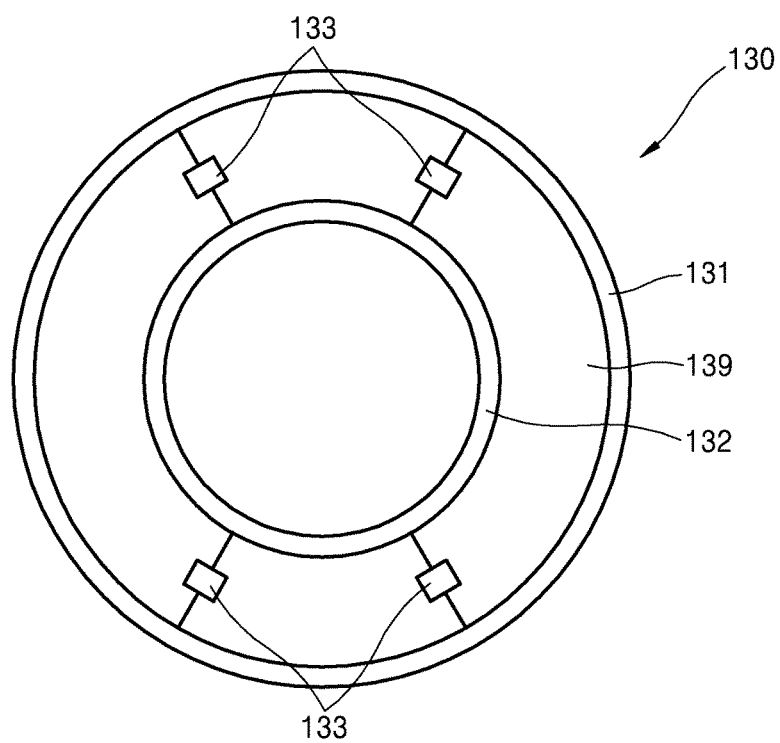
FIG. 5 illustrates the second circuit member of the RF trap of FIG. 1.

FIG. 5 illustrates an example of a specific circuit for the second circuit member. Referring to FIG. 5, the second circuit member 130 includes conductor circuits 131 and 132 formed on a circular board surface 139 and a capacitor 133. An outer conductor circuit 131 is formed in the outer perimeter of the circular board surface 139 and an inner conductor circuit 132 is formed in the inner perimeter of the circular board surface 139. The outer conductor circuit 131 is electrically connected to the outer conductive thin film 111 of the electromagnetic wave shield 110 and the inner conductor circuit 132 is electrically connected to the inner conductive thin film 112 of the electromagnetic wave shield 110. When the board surface 139 on which the conductor circuits 131 and 132 of the second circuit member 130 are formed directly contacts and are connected to an end of the electromagnetic wave shield 110, the outer and inner conductor circuits 131 and 132 are directly connected to the outer and inner conductive thin films 111 and 112 respectively. When the rear surface of the board surface 139 on which the conductor circuits 131 and 132 of the second circuit member 130 are formed directly contacts and is connected to the end of the electromagnetic wave shield 110, a through hole (not illustrated) is formed in the board of the second circuit member 130, or the outer and inner conductor circuits 131 and 132 extend to respectively bypass the outer side and inner side of the board, and thus, the outer and inner conductor circuits 131 and 132 are electrically connected to the outer and inner conductive thin films 111 and 112.

The both ends of the capacitor or capacitors 133 are respectively connected to the outer and inner conductor circuits 131 and 132. The capacitor 133 generates the capacitance of the RF trap 100. The capacitor 133 may be mounted at one position or a plurality of positions. By properly selecting the number of capacitors 133 and the capacitance, the capacitance of the RF trap 100 may be adjusted.

As illustrated, an inductance is finely adjusted by selectively adjusting the electrical connection position of the first circuit member 120 and the capacitance of the RF trap 100 is finely adjusted by properly selecting the number of the capacitors 133 installed in the second circuit member 130 and the capacitance. By combining the inductance and the capacitance, an impedance and a capacitance according to a relevant frequency of a signal source transmitted through the electric cable 190 may be generated. Therefore, the RF trap 100 according to an exemplary embodiment may effectively eliminate or attenuate a signal component induced from the electric cable 190.

Figure 12:
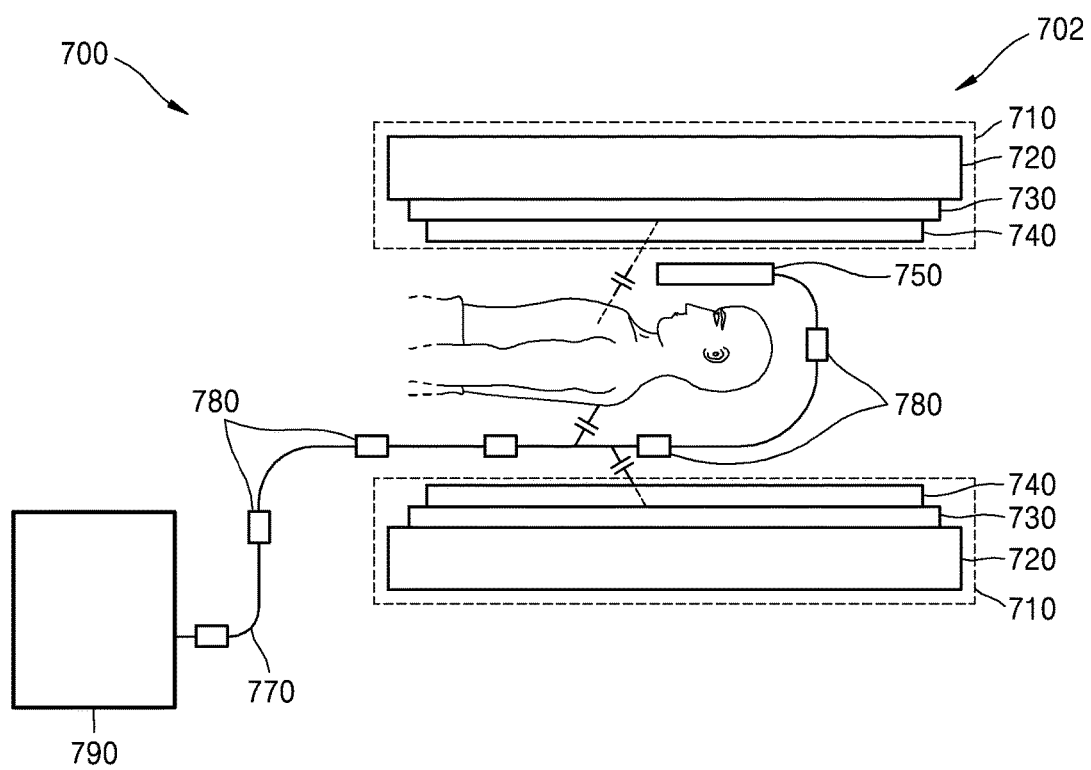
FIG. 12 schematically illustrates a superconducting magnet apparatus according to an exemplary embodiment.

The RF trap 100 according to an exemplary embodiment may be used in an environment in which magnetic field is very strong as in a superconducting magnet device (see 700 of FIG. 12). Since the use of a solenoid coil type inductor is limited in an environment in which magnetic field is strong, in an existing RF trap used in the environment in which magnetic field is strong, an inductance is adjusted by changing the shape of a conductive thin film or a conductor in the RF trap or a required load impedance value is set only using combination of capacitors and thus, there is a difficulty in exact frequency tuning. On the other hand, the frequency trap 100 according to an exemplary embodiment finely adjusts the inductance by selecting the electrical connection positions of the first circuit member 120, thereby exactly performing frequency tuning and thus, effectively removing and attenuating signal components induced from the electric cable 190.

Figure 6:
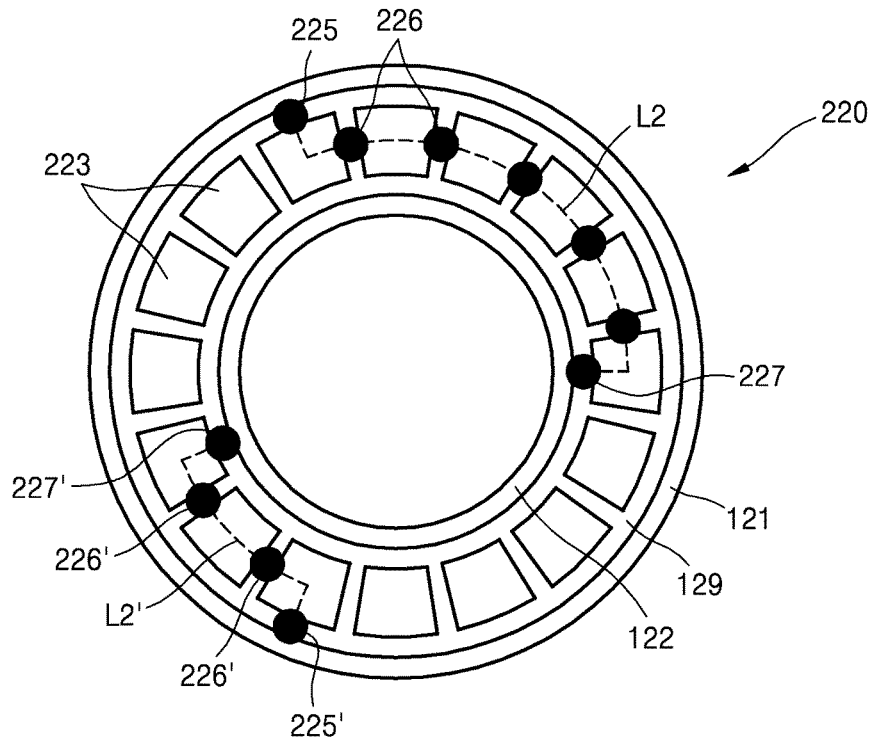
FIG. 6 illustrates another example of the first circuit member of the RF trap of FIG. 1.

FIG. 6 illustrates a first circuit member 220 that is another example which is employable for the RF trap of FIG. 1. Referring to FIG. 6, the first circuit member 220 includes conductor circuits 121, 122 and 223 formed on the circular board surface 129. The outer and inner conductor circuits 121 and 122 are electrically connected to the outer and inner conductive thin films 111 and 112 of the electromagnetic wave shield 100 similarly to the first circuit member 120 described with reference to FIG. 3.

A central conductor circuit 223 may be a plurality of conductor strips arranged in a row or a string, for example, adjacent one another and substantially parallel to one another, along a ring on the circular board surface 129. The central conductor circuit 223 is formed between and apart from the outer conductor circuit 121 and the inner conductor circuit 122. The central conductor circuit 223 and the outer conductor circuit 121 are electrically connected to each other through first solders 225 and 225'. The plurality of conductor strips of the central conductor circuit 123 are connected to each other through second solders 226 and 226' and the central conductor circuit 123 and the inner conductor circuit 122 are connected to each other through third solders 227 and 227'. The plurality of conductor strips of the central conductor circuit 123 are electrically connected to each other through the second solders 226 and 226' to form an effective current path. Since the outer conductor circuit 121 and the inner conductor circuit 122 are electrically connected to the outer conductive thin film 111 and the inner conductive thin film 112 of the electromagnetic wave shield 110 respectively as described above, the lengths L2 and L2' of the outer conductive thin film 111 and the inner conductive thin film 112 of the electromagnetic wave shield 110 are adjustable by selecting the positions (that is, electrical connection positions) of the first solders 225 and 225', the second solders 226 and 226' and the third solders 227 and 227', thereby adjusting the inductance of the RF trap 100.

Figure 7:
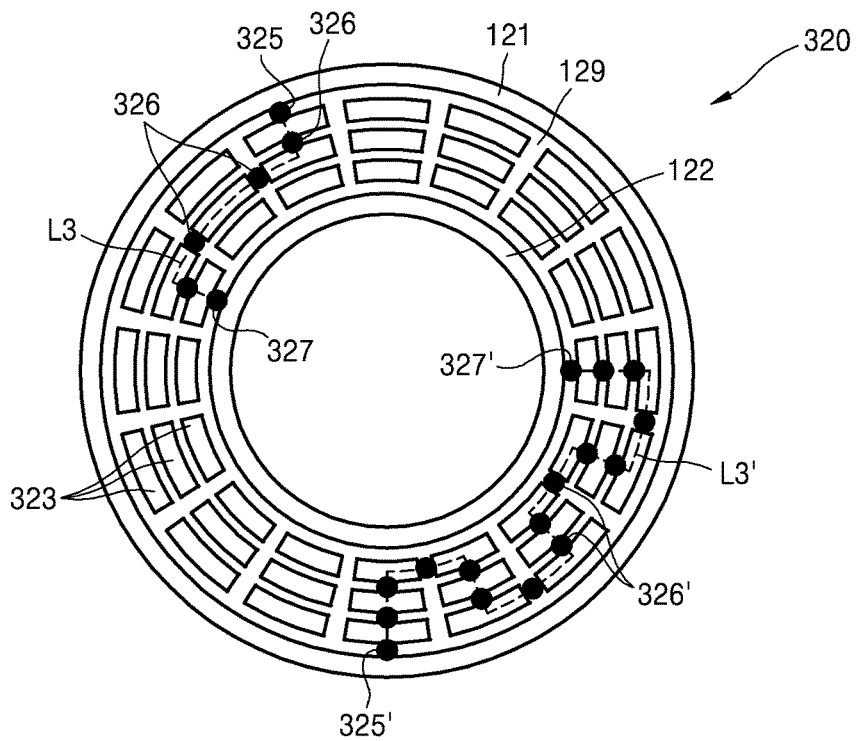
FIG. 7 illustrates another example of the first circuit member of the RF trap of FIG. 1.

FIG. 7 illustrates a first circuit member 320 that is another example which is employable for the RF trap of FIG. 1. Referring to FIG. 7, the first circuit member 320 includes conductor circuits 121, 122 and 323 formed on the circular board surface 129. The outer and inner conductor circuits 121 and 122 are electrically connected to the outer and inner conductive thin films 111 and 112 of the electromagnetic wave shield 110 similarly to the first circuit member 120 described with reference to FIG. 3.

A central conductor circuit 323 may be a plurality of conductor strips arranged in a mesh grid shape on the circular board surface 129. The central conductor circuit 323 is formed between and apart from the outer conductor circuit 121 and the inner conductor circuit 122. The central conductor circuit 323 and the outer conductor circuit 121 are electrically connected to each other through first solders 325 and 325'. The plurality of conductor strips of the central conductor circuit 123 are connected to each other through second solders 326 and 326' and the central conductor circuit 123 and the inner conductor circuit 122 are connected to each other through third solders 327 and 327'. The plurality of conductor strips of the central conductor circuit 123 are electrically connected to each other through the second solders 326 and 326' to form an effective current path. As illustrated in FIG. 7, the position of the second solder 326 is selected so as to set a current path L3 which is a shorter distance between the first solder 325 and the third solder 327, or the position of the second solder 326' is selected so as to set a current path L3' having a meander line shape of a longer distance between the first solder 325' and the third solder 327'. Since the outer conductor circuit 121 and the inner conductor circuit 122 are electrically connected to the outer conductive thin film 111 and the inner conductive thin film 112 of the electromagnetic wave shield 110 as described above, the lengths L3 and L3' of the outer conductive thin film 111 and the inner conductive thin film 112 of the electromagnetic wave shield 110 are adjustable by changing the positions (that is, electrical connection positions) of the first solders 325 and 325', the second solders 326 and 326' and the third solders 327 and 327', thereby adjusting the inductance of the RF trap 100. Since the plurality of conductor strips of the central conductor circuit 323 are arranged in two dimensions in the RF trap 100 of an exemplary embodiment, various patterns of current paths are selectively set, thereby finely adjusting an inductance value in a wider range. The mesh grid shape of the central conductor circuit 323 is not limited to the shape illustrated in FIG. 7 and the plurality of conductor strips may be arranged in two dimensions according to various shapes.

Although the circuit board attached to the end of the electromagnetic wave shield 110 is described as examples of circuit members for inductance adjustment and capacitance adjustment in the above-described exemplary embodiments, this is not limiting. For example, the conductor circuit may be directly formed or the capacitor may be attached at both ends of the cylindrical dielectric of the electromagnetic wave shield 110.

Figure 8:
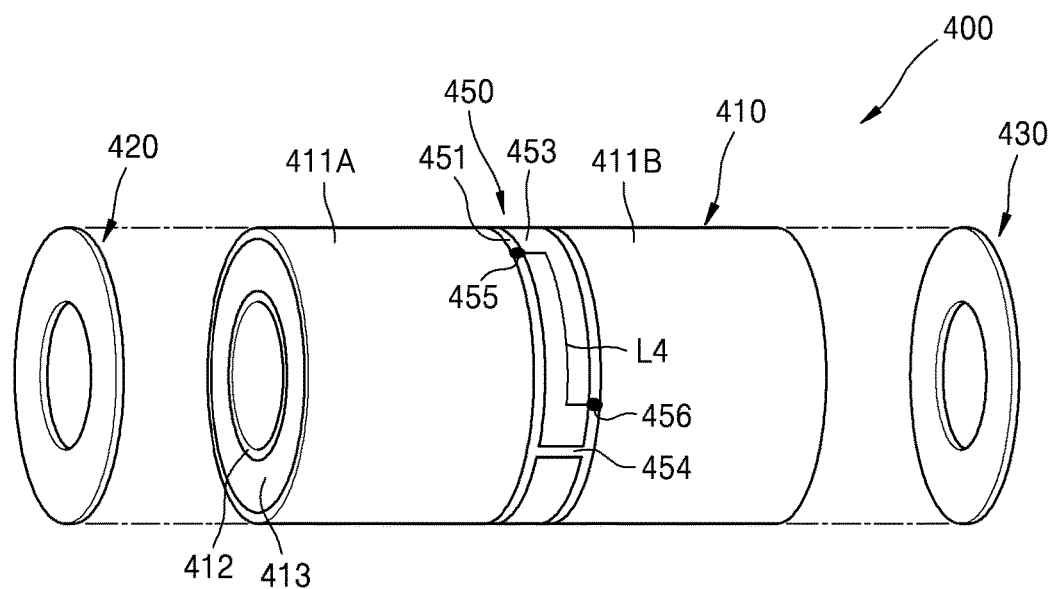
FIG. 8 schematically illustrates an RF trap according to an exemplary embodiment.

FIG. 8 schematically illustrates an RF trap 400 according to an exemplary embodiment.

Referring to FIG. 8, the RF trap 400 according to an exemplary embodiment includes an electromagnetic wave shield 410 and a central circuit member 450 for inductance adjustment.

The electromagnetic wave shield 410 includes a cylindrical dielectric 413, a first outer conductive thin film 411A and a second outer conductive thin film 411B which are provided on the outer circumferential surface of the cylindrical dielectric 413, and an inner conductive thin film 412 provided on the inner circumferential surface of the cylindrical dielectric 413. The first outer conductive thin film 411A and the second outer conductive thin film 411B are spaced from each other and a part of the outer circumferential surface of the cylindrical dielectric 413 is exposed to outside. An electric cable is expected to pass through the hollow of the cylindrical dielectric 413.

The central circuit member 450 is provided on an exposed side circumference 451 of the cylindrical dielectric 413 between the first outer conductive thin film 411A and the second conductive thin film 411B. The central circuit member 450 includes a conductor circuit 453 formed on the exposed side circumference 451 of the cylindrical dielectric 413. The conductor circuit 453 is formed apart from and between the first outer conductive thin film 411A and the second outer conductive thin film 411B. The conductor circuit 453 is formed along the circumference of the cylindrical dielectric 413 and has at least one gap 454 to be short-circuited.

The conductor circuit 453 is electrically connected to the first outer conductor thin film 411A through a first solder 455 and the conductor circuit 453 is electrically connected to the second outer conductor thin film 411B through a second solder 456. The positions (that is, electrical connection positions) of the first and second solders 455 and 456 determine the length of a current path L4 of the first and second outer conductive thin films 411A and 411B of the electromagnetic wave shield 410. The RF trap 400 of an exemplary embodiment may adjust the length of the current path of the first and second outer conductive thin films 411A and 411B by adjusting the positions (that is, electrical connection positions) of the solders of the central circuit member 450, which means that the inductance of the RF trap 400 is adjustable by properly selecting the positions of the solders. Although an exemplary embodiment is described using solders as a method of performing electrical connections, the electrical connections may be performed using wiring, conductive tape adhesion, or other known methods. Although an exemplary embodiment is described for the case where electrical connection is made at two positions, the electrical connection may be made at three or more positions.

Although the conductor circuit 453 of the central circuit member 450 is described as directly provided on the exposed side circumference of the cylindrical dielectric 413 between the first outer conductive thin film 411A and the second outer conductive thin film 411B, an exemplary embodiment is not limited thereto. The central circuit member 450 may be a flexible printed circuit board attached to an exposed side circumference of the electromagnetic wave shield 410 between the first outer conductive thin film 411A and the second conductive thin film 411B.

A first circuit member 420 and/or a second circuit member 430 may be additionally provided at both ends of the electromagnetic wave shield 410. The first circuit member 420 may be a circuit member in which a conductor circuit having an adjustable inductance is formed as described with reference to FIGS. 3, 6 and 7, and the second circuit member 430 may be a circuit member having an adjustable capacitance as described with reference to FIG. 5. Alternatively, the first and second circuit members 420 and 430 may be a circuit member in which a conductor circuit having an adjustable inductance is formed as described with reference to FIGS. 3, 6 and 7, or a circuit member having an adjustable capacitance as described with reference to FIG. 5. At least one of the first and second circuit members 420 and 430 may be a dummy circuit.

As described above, the inductance and/or capacitance of the RF trap 100 may be finely adjusted by the central circuit member 450 and the first and second circuit members 420 and 430 which may be additionally provided. An impedance and a capacitance according to the frequency of a signal source transmitted through an electric cable may be generated by a combination of the inductance and the capacitance, thereby the induced signal source may be effectively removed or attenuated.

Figure 9:
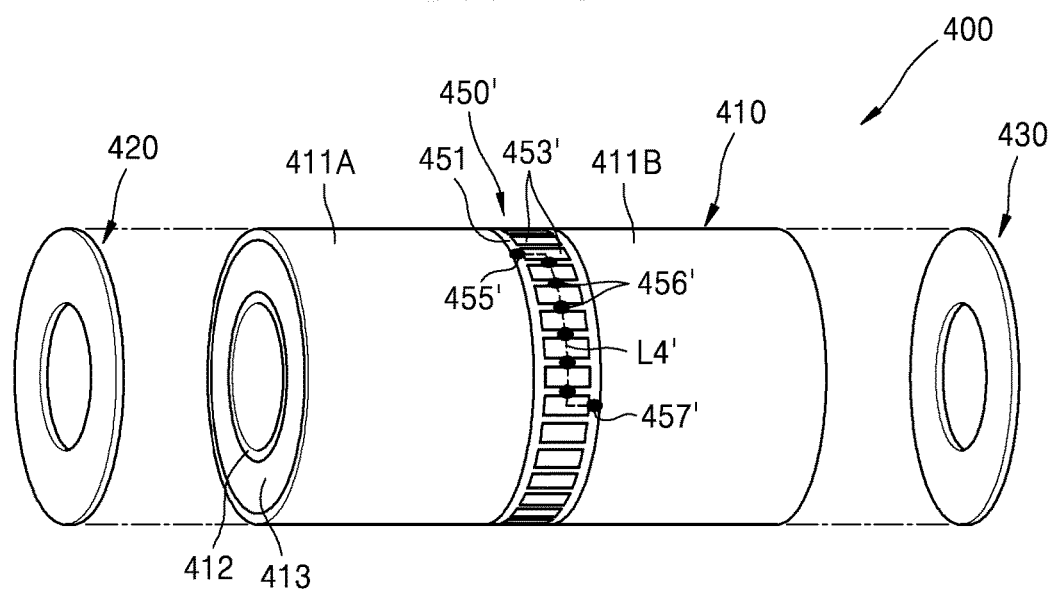
FIG. 9 illustrates another example of the central circuit member of the RF trap of FIG. 8.

FIG. 9 illustrates an RF trap 400 employing a central circuit member 450' according to an exemplary embodiment. Referring to FIG. 9, the central circuit member 450' includes a conductor circuit 453' formed on the exposed side circumference 451 of the cylindrical dielectric 413. The conductor circuit 453' is formed between and apart from the first outer conductive thin film 411A and the second outer conductive thin film 411B. The conductor circuit 453' may be a plurality of conductor strips arranged in a row along the circumference of the cylindrical dielectric 413.

The conductor circuit 453' and the first outer conductive thin film 411A are electrically connected to each other through a first solder 455'. The plurality of conductor strips of the conductor circuit 453' are electrically connected to each other through second solders 456', and the conductor circuit 453' is electrically connected to the second outer conductive thin film 411B through a third solder 457'. The plurality of conductor strips of the conductor circuit 453' are electrically connected to each other through the second solders 456' to form an effective current path. As described above, since the central circuit member 450' electrically connects the first outer conductive thin film 411A and the second outer conductive thin film 411B of the electromagnetic wave shield 110, the length L4' of the current path of the first and second outer conductive thin films 411A and 411B of the electromagnetic wave shield 110 may be adjusted by changing the positions (electrical connection positions) of the first to third solders 455', 456' and 457', thereby adjusting the inductance of the RF trap 400.

Although the conductor circuit 453' of the central circuit member 450' is described as being formed of the plurality of conductor strips arranged in a string adjacent one another along the exposed side circumference 451 of the cylindrical dielectric 413 according to an exemplary embodiment, an exemplary embodiment is not limited thereto. As in FIG. 7, the conductor circuit 453' of the central circuit member 450' may be a plurality of conductor strips arranged in two dimensions along the exposed side circumference 451 of the cylindrical dielectric 413.

Figure 10:
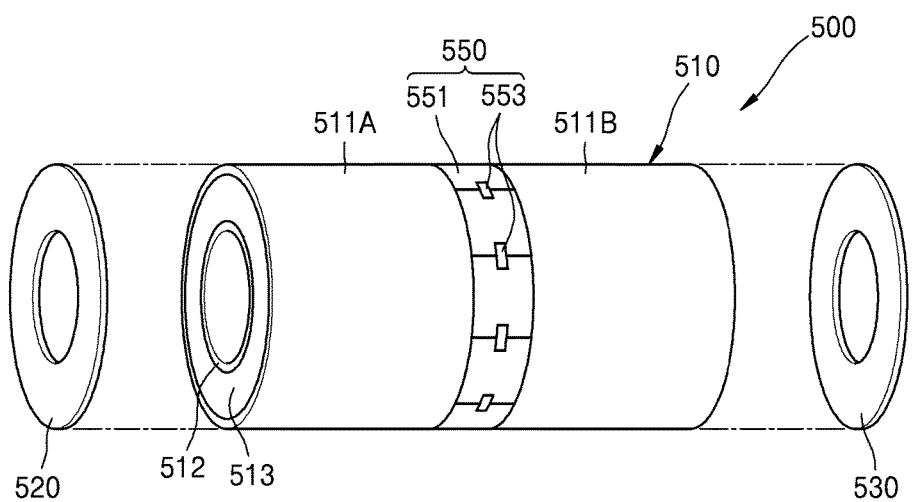
FIG. 10 schematically illustrates an RF trap according to an exemplary embodiment.

FIG. 10 schematically illustrates an RF trap 500 according to an exemplary embodiment.

Referring to FIG. 10, the RF trap 500 according to an exemplary embodiment includes an electromagnetic wave shield 510, a first circuit member 520, and a central circuit member 550 for capacitance adjustment.

The electromagnetic wave shield 510 includes a cylindrical dielectric 513, a first outer conductive thin film 511A and a second outer conductive thin film 511B which are provided on the outer circumferential surface of the cylindrical dielectric 513, and an inner conductive thin film 512 which is provided on the inner circumferential surface of the cylindrical dielectric 513. The first outer conductive thin film 511A is spaced apart from the second outer conductive thin film 511B and thus, a part of the outer circumferential surface of the cylindrical dielectric 513 is exposed to outside. An electric cable is expected to pass through a hollow of the cylindrical dielectric 513.

The first circuit member 520 for inductance adjustment is provided in an end of the electromagnetic wave shield 510. The first circuit member 520 may be a circuit on which a conductor circuit having an adjustable inductance is formed as described with reference to FIGS. 3, 6 and 7.

The central circuit member 550 is provided on an exposed side circumference 551 of the cylindrical dielectric 513 between the first outer conductive thin film 511A and the second conductive thin film 511B. The central circuit member 550 includes a capacitor or capacitors 553. The ends of the capacitor 553 are connected respectively to the first outer conductor thin film 511A and the second outer conductor thin film 511B. The capacitor 553 generates the capacitance of the RF trap 500. The capacitor 553 may be mounted at one position or a plurality of positions. The capacitance of the RF trap 500 may be adjusted by properly selecting the number of the capacitors 553 and the capacitance.

The second circuit member 530 may be additionally provided in the other end of the electromagnetic wave shield 510. The second circuit member 530 may be a circuit in which a conductor circuit having an adjustable inductance is formed as described with reference to FIGS. 3, 6 and 7, or a circuit member having an adjustable capacitance as described with reference to FIG. 5. Alternatively, the second circuit member 530 may be a dummy circuit.

As described above, the inductance and/or capacitance of the RF trap 500 may be finely adjusted by the first circuit member 520, the central circuit member 550, and the second circuit member 530 which may be additionally provided. An impedance and a capacitance according to the frequency of a signal source transmitted through an electric cable may be generated by the combination of the inductance and the capacitance, thereby the induced signal source may be effectively removed or attenuated.

Although the RF trap 400 described with reference to FIGS. 8 and 9 or the RF trap 500 described with reference to FIG. 10 are used to adjust the inductance and/or the capacitance, a conductor circuit having an adjustable current path and a capacitor may be provided along with the central circuit member.

Figure 11:
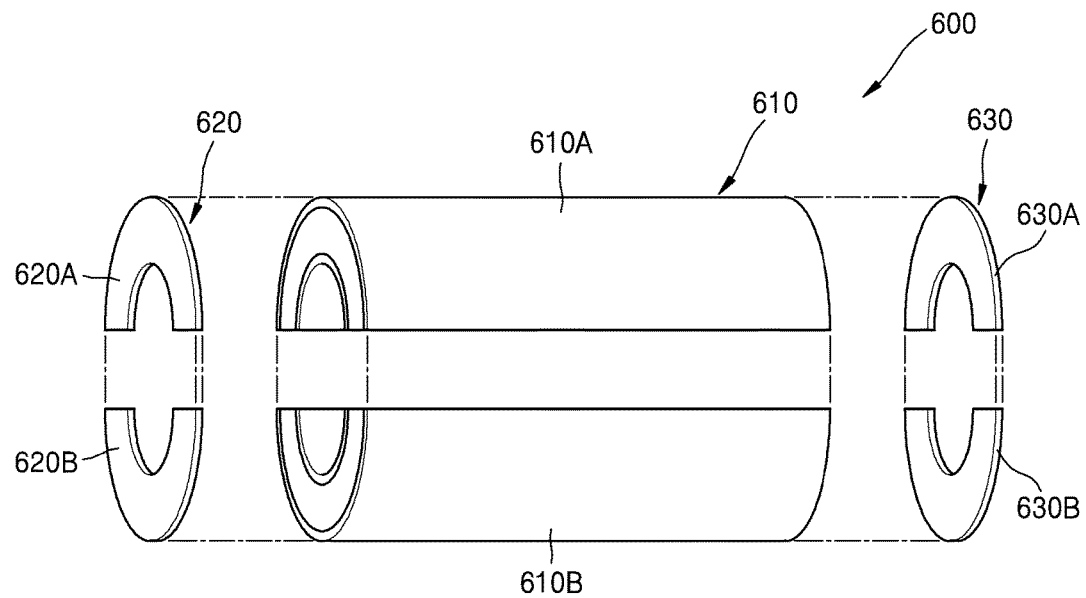
FIG. 11 schematically illustrates an RF trap according to an exemplary embodiment.

FIG. 11 schematically illustrates an RF trap 600 according to an exemplary embodiment.

Referring to FIG. 11, the RF trap according to an exemplary embodiment includes an electromagnetic wave shield 610 and first and second circuit members 620 and 630.

The electromagnetic wave shield 610 includes two semi-cylindrical electromagnetic wave shield portions 610A and 610B which are connectable to each other. For example, the semi-cylindrical electromagnetic wave shield portions 610A and 610B may have structures (for example, bolt-nut fastening structures or hinged structures) which are connectable and detachable to each other or may be connected to each other using adhesive. The semi-cylindrical electromagnetic wave shield portions 610A and 610B form a cylinder when being assembled to each other. The structure in which semi-cylindrical electromagnetic wave shield portions 610A and 610B are connected to each other may be any one of the electromagnetic wave shields 110, 410 and 510 of the above-described exemplary embodiments.

The first circuit member 620 includes two semi-circular circuit members 620A and 620B corresponding to the detachable structure of the electromagnetic wave shield 610. The two semi-circular circuit members 620A and 620B may be respectively attached to one-side ends of the two semi-cylindrical electromagnetic wave shield portions 610A and 610B. A structure in which the two semi-circular circuit members 620A and 620B are connected to each other may be any one of the first circuit members 120, 220, 320, 420 and 520 of the above-described exemplary embodiments.

The second circuit member 630 may also include two semi-circular circuit members 630A and 630B corresponding to the detachable structure of the electromagnetic wave shield 610. The two semi-circular circuit members 630A and 630B may be respectively attached to the other-side ends of the two semi-cylindrical electromagnetic wave shield portions 610A and 610B. A structure in which the two semi-circular circuit members 630A and 630B are connected to each other may be any one of the second circuit members 130, 430 and 530 of the above-described exemplary embodiments.

The RF trap 600 according to the present exemplary embodiment is substantially identical to the structure of the RF trap 100, 400, or 500 of the above-described exemplary embodiments, except that the RF trap 600 may be divided into parts and the parts may be connected to each other, and, thus, redundant descriptions will be omitted.

Since the RF trap 600 is divided into parts and the parts are connected to each other as described above, the electric cable 190 is easily mounted.

Although the electromagnetic wave shields 110, 410, 510 and 610 have a cylindrical shape in the above-described exemplary embodiments, an exemplary embodiment is not limited thereto. For example, the electromagnetic wave shield may have a structure of surrounding a part of the electric cable 190 to shield electromagnetic wave of the electric cable 190. For example, the electromagnetic wave shield may have the shape of a polyprism having a hollow.

FIG. 12 schematically illustrates a superconducting magnet apparatus 700 according to an exemplary embodiment.

The superconducting magnet apparatus 700 according to an exemplary embodiment includes a body, i.e., a magnetic assembly or an MR scanner 702, in which an imaging space for magnetic resonance imaging is provided, to which magnetic field is applied. The body may include a cylindrical housing 710 having, for example, a hollow, a main magnet 720 mounted in the housing 710, a gradient coil assembly 730, and a first radio frequency coil assembly 740. An object is placed in the imaging space (for example, the hollow of the housing 710) and magnetic resonance imaging is performed in a state in which strong magnetic field is applied thereto. A second radio frequency coil assembly 750 may be provided additionally in the imaging space in order to detect magnetic resonance signals from the object.

The main magnet 720 generates a main magnetic field for magnetizing an atom generating magnetic resonance phenomenon, that is, an atomic nucleus, such as hydrogen, phosphorus, or sodium, of atoms distributed in a human body and the superconducting magnet is used to generate a magnetic field higher than, for example, 0.5T. The gradient coil assembly 730 generates spatially linear gradient magnetic field in order to obtain magnetic resonance images and three gradient coils are generally used to form gradient magnetic field in x-, y-, and z-directions for magnetic resonance imaging. The gradient coil spatially controls the rotation frequency or phase of a magnetization vector when the magnetization vector rotates in a transverse plane to enable magnetic resonance imaging signals to be represented in a spatial frequency area, that is, k-space. The first and second RF coil assemblies 740 and 750 are used to apply electromagnetic waves to the human body and receive magnetic resonance signals in order to resonate the magnetization vector within the human body.

A controller 790 that drives and controls the main magnet 720, the gradient coil assembly 730, and the first and second radio frequency coil assemblies 740 and 750 is provided outside the body. The controller 790 is electrically connected to the main magnet 720, the gradient coil assembly 730, and the first and second radio frequency coil assemblies 740 and 750 through the electric cable 770. RF traps 780 are mounted partially or continuously in the electric cable 770, for example, only in certain portions of the electric cable 770 or at positions spaced along substantially entire electric cable 770. The RF traps 100, 400, 500 and 600 of the above-described exemplary embodiments are employed as the RF trap 780.

Power for driving the main magnet 720, the gradient coil assembly 730, and the first and second radio frequency coil assemblies 740 and 750 and/or the magnetic resonance signals detected from the first and second radio frequency coil assemblies 740 and 750 may be transmitted via the electric cable 770. The RF trap 780 may remove noise and prevent bad influence (pyrexy, delivery to a human body, or equipment damage) due to power induced on the electric cable 770 by blocking a common mode current induced on the electric cable 770. For example, when a Tx high power is transmitted to the electric cable 770 connected to the second radio frequency coil assembly 750, the RF trap 780 prevents the Tx high power from being induced on the ground line of the electric cable 770. Although the electric cable 770 is illustrated as connecting the second radio frequency coil assembly 750 and the controller 790, the controller 790 may be connected via the electric cable 770 to other elements.

Since strong magnetic field is applied to the superconducting magnet apparatus 700, there is limitation to use a related art RF trap having a solenoid coil type inductor. Since the RF trap 780 according to an exemplary embodiment does not use a solenoid coil type inductor, there is no limitation to be used within the strong magnetic field of the superconducting magnet device 700. Since an inductance may be finely adjusted as described above, a load impedance value suitable for a relevant frequency of a current flowing through the electric cable 770 is optimally generated, thereby effectively removing and attenuating a signal source emitting high frequencies.

Although the superconducting magnet apparatus 700 according to an exemplary embodiment is described as a magnetic resonance imaging apparatus, those skilled in the art may easily understand that the superconducting magnet apparatus 700 is applicable to a nuclear magnetic resonance (NMR) apparatus or a superconducting magnet apparatus for a magnetic levitation vehicle.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A radio frequency (RF) trap comprising:
    an electromagnetic wave shield which includes a conductive shield member and is configured to surround an electric cable; and
    a circuit member which is provided in a portion of the electromagnetic wave shield, and includes a conductor circuit electrically connected to the conductive shield member in at least two positions,
    wherein the at least two positions at which the conductive shield member is electrically connected to the conductor circuit are selectively adjusted so that a current path of the conductor circuit is adjustable according to the at least two positions at which electrical connections are made.

2. The RF trap of claim 1, wherein the electrical connections are made by soldering or wiring.

3. The RF trap of claim 1, wherein the electromagnetic wave shield has a cylindrical shape.

4. The RF trap of claim 3, wherein the electromagnetic wave shield further includes a cylindrical dielectric, and
    the conductive shield member includes a conductive thin film provided on at least one of an inner circumferential surface and an outer circumferential surface of the cylindrical dielectric.

5. The RF trap of claim 4, wherein the circuit member is disposed in at least one of a front end and a rear end of the electromagnetic wave shield.

6. The RF trap of claim 5, wherein the circuit member has a flat donut shape.

7. The RF trap of claim 6, wherein the conductor circuit includes a circular conductor formed on a surface of the circuit member, and
    the circular conductor has at least one gap and is short-circuited.

8. The RF trap of claim 6, wherein the conductor circuit includes conductor strips arranged along a circle on a surface of the circuit member.

9. The RF trap of claim 6, wherein the conductor circuit includes conductor strips arranged in a mesh grid shape on a surface of the circuit member.

10. The RF trap of claim 3, wherein the conductor circuit is disposed in a side of the electromagnetic wave shield.

11. The RF trap of claim 1, wherein the electromagnetic wave shield includes a cylindrical dielectric, and
    the conductive shield member is provided on an outer circumferential surface of the cylindrical dielectric and includes a first conductive thin film and a second conductive thin film spaced apart from each other in a length direction of the cylindrical dielectric, thereby forming a gap between the first conductive thin film and the second conductive thin film on the outer circumferential surface of the cylindrical dielectric.

12. The RF trap of claim 11, wherein the conductor circuit is provided between the first conductive thin film and the second conductive thin film in the gap formed on the outer circumferential surface of the cylindrical dielectric.

13. The radio frequency trap of claim 12, wherein the conductor circuit includes a circular conductor formed along the outer circumferential surface of the cylindrical dielectric, and
    the circular conductor has at least one gap and is short-circuited.

14. The radio frequency trap of claim 12, wherein the conductor circuit includes conductor strips arranged along the outer circumferential surface of the cylindrical dielectric.

15. The RF trap of claim 1, wherein the electromagnetic wave shield is divided into semi-cylindrical shaped portions.

16. The RF trap of claim 1, wherein the circuit member further comprises a capacitor.

17. The RF trap of claim 13, wherein the circuit member further includes:
    a first capacitor provided in one of a front end and a rear end of the cylindrical dielectric; and
    a second capacitor provided in other end of the front end and the rear end of the electromagnetic wave shield.

18. The RF trap of claim 13, wherein the circuit member further comprises a capacitor provided in a side surface of the electromagnetic wave shield.

19. A superconducting magnet apparatus comprising:
    a magnetic assembly including a superconducting coil;
    a controller configured to drive and control the magnetic assembly;
    an electric cable configured to electrically connect the magnetic assembly to the controller; and
    a radio frequency (RF) trap which is mounted at the electric cable and includes:
        an electromagnetic wave shield which includes a conductive shield member and is configured to surround the electric cable, and
        a circuit member which is provided in a portion of the electromagnetic wave shield and comprises a conductor circuit electrically connected to the conductive shield member in at least two positions,
        wherein the at least two positions at which the conductive shield member is electrically connected to the conductor circuit are selectively adjusted so that a current path of the conductor circuit is adjustable according to the at least two positions at which electrical connections are made.

20. A magnetic resonance imaging (MRI) apparatus comprising:

a housing comprising an imaging space to which a magnetic field is applied;

a main magnet which is mounted in the housing to generate a main magnetic field;

a gradient coil assembly that is mounted in the housing to generate a gradient magnetic field;

a radio frequency (RF) coil assembly that is mounted within the housing or in the imaging space;

a controller configured to drive and control the main magnet, the gradient coil assembly, and the RF coil assembly;

an electric cable configured to connect at least one of the main magnet, the gradient coil assembly, and the RF coil assembly to the controller; and an RF trap which configured to be mounted at the electric cable and includes:
- an electromagnetic wave shield which includes a conductive shield member and is configured to surround the electric cable, and
- a circuit member which is provided in a portion of the electromagnetic wave shield and comprises a conductor circuit electrically connected to the conductive shield member in at least two positions,
- wherein the at least two positions at which the conductive shield member is electrically connected to the conductor circuit are selectively adjusted so that a current path of the conductor circuit is adjustable according to the at least two positions at which electrical connections are made.

* * * * *